(12) United States Patent
Matsuta

(10) Patent No.: US 7,304,510 B2
(45) Date of Patent: Dec. 4, 2007

(54) DIGITAL PHASE DETECTOR IMPROVING PHASE DETECTION RESOLUTION THEREOF

(75) Inventor: Hiroto Matsuta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/339,467

(22) Filed: Jan. 26, 2006

(65) Prior Publication Data

US 2007/0085570 A1  Apr. 19, 2007

(30) Foreign Application Priority Data

Oct. 13, 2005 (JP) ............................. 2005-298491

(51) Int. Cl.
*G01R 25/00* (2006.01)
(52) U.S. Cl. .............................................. 327/3; 327/5
(58) Field of Classification Search ...................... None
See application file for complete search history.

(56) References Cited

U.S. PATENT DOCUMENTS

| | | | | |
|---|---|---|---|---|
| 5,079,519 A | * | 1/1992 | Ashby et al. ............... | 331/1 A |
| 5,796,682 A | * | 8/1998 | Swapp ....................... | 368/120 |
| 6,011,412 A | * | 1/2000 | Byrn et al. ................. | 327/12 |
| 6,148,038 A | * | 11/2000 | Drost et al. ................. | 375/324 |
| 6,429,693 B1 | | 8/2002 | Staszewski et al. | |
| 6,775,345 B1 | * | 8/2004 | Song .......................... | 375/376 |
| 6,838,912 B1 | * | 1/2005 | Chou .......................... | 327/3 |
| 7,034,723 B2 | * | 4/2006 | Suda et al. ................. | 341/122 |

FOREIGN PATENT DOCUMENTS

| | | |
|---|---|---|
| JP | 2000-29564 A | 1/2000 |
| JP | 3143743 B2 | 1/2001 |
| JP | 2002-76886 A | 3/2002 |

\* cited by examiner

*Primary Examiner*—Cassandra Cox
(74) *Attorney, Agent, or Firm*—Arent Fox LLP

(57) ABSTRACT

A digital phase detector has a plurality of first delay elements through which a first clock is delayed, a plurality of second delay elements through which a second clock is delayed, and a plurality of data holding circuits. The data holding circuits latch the first clock successively delayed through the first delay elements and hold a digital value representing a relative phase difference, in accordance with the second clock successively delayed through the second delay elements. Therefore, the phase detection resolution of the digital phase detector can be improved.

9 Claims, 8 Drawing Sheets

US 7,304,510 B2

DIGITAL PHASE DETECTOR IMPROVING PHASE DETECTION RESOLUTION THEREOF

CROSS REFERENCE TO RELATED APPLICATION

This application is based upon and claims the benefit of priority from the prior Japanese Patent Application No. 2005-298491, filed on Oct. 13, 2005, the entire contents of which are incorporated herein by reference.

BACKGROUND OF THE INVENTION

1. Field of the Invention

The present invention relates to a digital phase detector and, more particularly, to a digital phase detector which is fabricated in a standard digital CMOS process and is used as a phase comparator in a Phase-Locked Loop (PLL) circuit.

2. Description of the Related Art

In a conventional analog PLL circuit, phase difference information from a phase comparator is given in the form of an output pulse width, and a charge pump circuit supplies a charge proportional to the pulse width to a control voltage terminal of a voltage-controlled oscillator (VCO). A loop filter, to which the control voltage terminal is also connected, converts the charge supplied from the charge pump circuit into a voltage value.

An analog PLL circuit such as described above uses analog devices such as a capacitive device and a resistive device, but since such analog devices cannot be fabricated using a standard digital CMOS process, different options are often needed. Furthermore, in cases where these analog devices become a dominant factor in determining the area that the PLL circuit occupies, the benefits of the recent digital CMOS miniaturization cannot be taken advantage of. Moreover, the analog configuration has two or more poles in the loop of the PLL circuit; therefore, if the bandwidth of the loop is set wide, the phase margin is reduced and, as a result, it becomes difficult to reduce the response time of the PLL circuit.

In view of the above situation, research and development of an all digital PLL (Phase-Locked Loop) circuit, in which all of the constituent elements are digital has been proceeding in recent years. To implement such an all digital PLL circuit, a digital phase comparator that outputs a phase difference in the form of a digital code becomes necessary in place of a phase comparator, such as used in an analog PLL circuit, which converts phase difference information into an output pulse time difference.

In the prior art, Japanese Unexamined Patent Publication (Kokai) No. 2002-076886 discloses a digital phase detector that is capable of accommodating a quantization scheme to measure delay differences between the edge of a VCO output clock and a reference clock by using a time-to-digital converter to express the time difference as a digital code for use by a frequency synthesizer.

Further, in the prior art, Japanese Patent No. 3143743 (corresponding to Japanese Unexamined Patent Publication (Kokai) No. 20002-029564) discloses, as a phase synchronization technique that can compensate for a delay time while reducing power consumption, a high-speed phase synchronization circuit which generates a measurement start signal and a measurement end signal by measuring the phase of a reference clock signal externally input by an enable signal and the phase of its feedback clock signal, outputs a delay time compensating cycle determining signal for each measured delay unit by using the two signals, generates a delay time compensating signal in accordance with the delay time compensating cycle determining signal, and outputs a phase-synchronized clock signal by delaying the reference clock signal.

The prior art and its associated problem will be described in detail later with reference to relevant drawings.

SUMMARY OF THE INVENTION

An object of the present invention is to provide a digital phase detector improving the phase detection resolution thereof.

According to the present invention, there is provided a digital phase detector comprising a plurality of first delay elements through which a first clock is delayed; a plurality of second delay elements through which a second clock is delayed; and a plurality of data holding circuits which, in accordance with the second clock successively delayed through the second delay elements, latch the first clock successively delayed through the first delay elements and hold a digital value representing a relative phase difference.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before describing in detail the preferred embodiments of a digital phase detector according to the present invention, a conventional digital phase detector and its associated problems will be described with reference to FIGS. 1 and 2.

Figure 1:
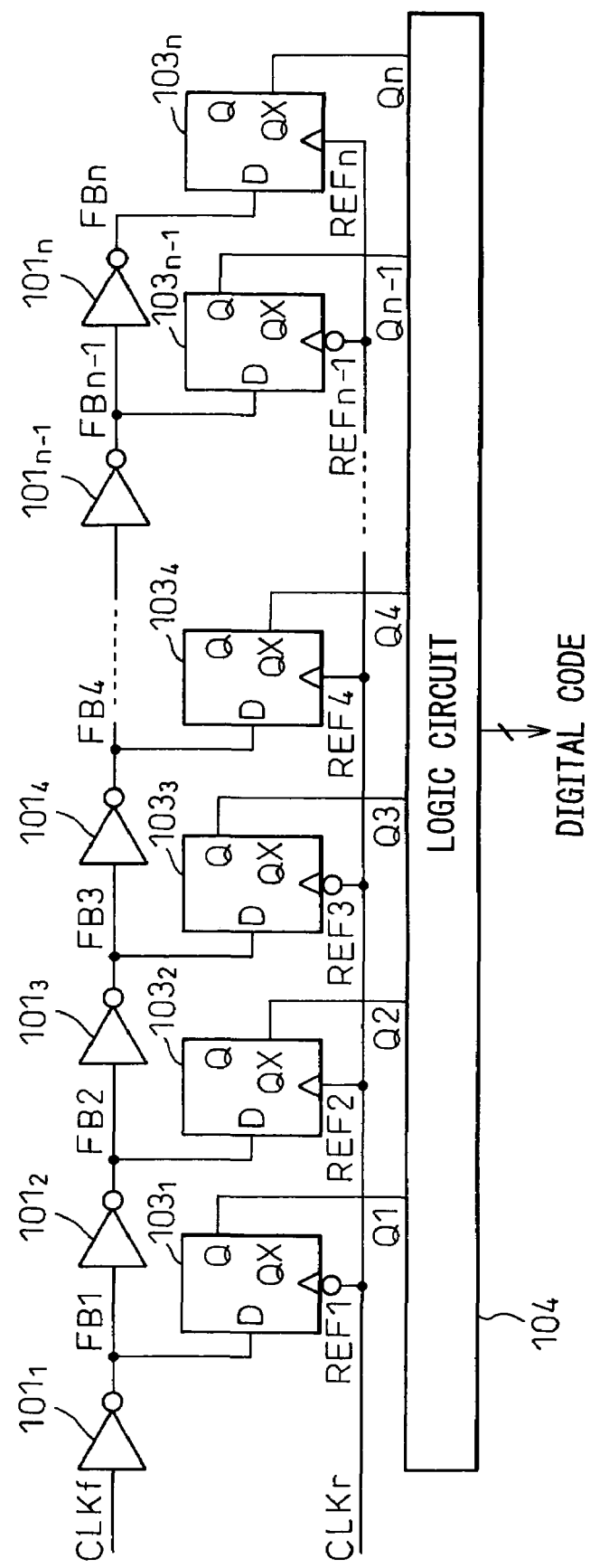
FIG. 1 is a block circuit diagram schematically showing one example of a prior art digital phase detector.

FIG. 1 is a block circuit diagram schematically showing one example of the prior art digital phase detector. In FIG. 1, reference numerals $101_1$ to $101_n$ are delay elements (inverters), $103_1$ to $103_n$ are data holding circuits (flip-flops), 104 is a logic circuit, CLKf is a feedback clock, and CLKr is a reference clock.

As shown in FIG. 1, in the prior art digital phase detector, the feedback clock CLKf is passed through the plurality of delay elements $101_1$ to $101_n$ to generate feedback clocks (clocks FB1 to FBn) successively delayed by the delay time of each of the delay elements $101_1$ to $101_n$, thereby successively changing the phase relationship relative to the reference clock CLKr (clocks REF1 to REFn). Here, each of the delay elements $101_1$ to $101_n$ has the same delay time.

The data holding circuit $103_1$ latches by the edge (rising edge) of the reference clock REF1 the clock (feedback clock) FB1 generated by delaying the feedback clock CLKf through the single-stage delay element $101_1$. Likewise, the data holding circuit $103_2$ latches by the edge of the reference clock REF2 the feedback clock FB2 generated by delaying the feedback clock CLKf through the two stages of delay elements $101_1$ and $101_2$.

Further, the data holding circuit $103_n$ latches by the edge of the reference clock REFn the feedback clock FBn generated by delaying the feedback clock CLKf through the n stages of delay elements $101_1$ to $101_n$. Here, the reference clocks REF1 to REFn supplied to the respective data holding circuits $103_1$ to $103_n$ each have the same phase as the input reference clock CLKr.

That is, the data holding circuits $103_1$ to $103_n$ latch by the edges of the respective reference clocks REF1 to REFn (CLKr) with the same phase the respective feedback clocks FB1 to FBn generated by successively delaying the feedback clock CLKf through the first delay elements $101_1$ to $101_n$, and output the phase differences between the feedback clocks FB1 to FBn and their corresponding reference clocks REF1 to REFn (CLKr) as digital signals Q1 to Qn to the logic circuit 104. The logic circuit 104 outputs a digital code by detecting a logic change in the signals Q1 to Qn.

Figure 2:
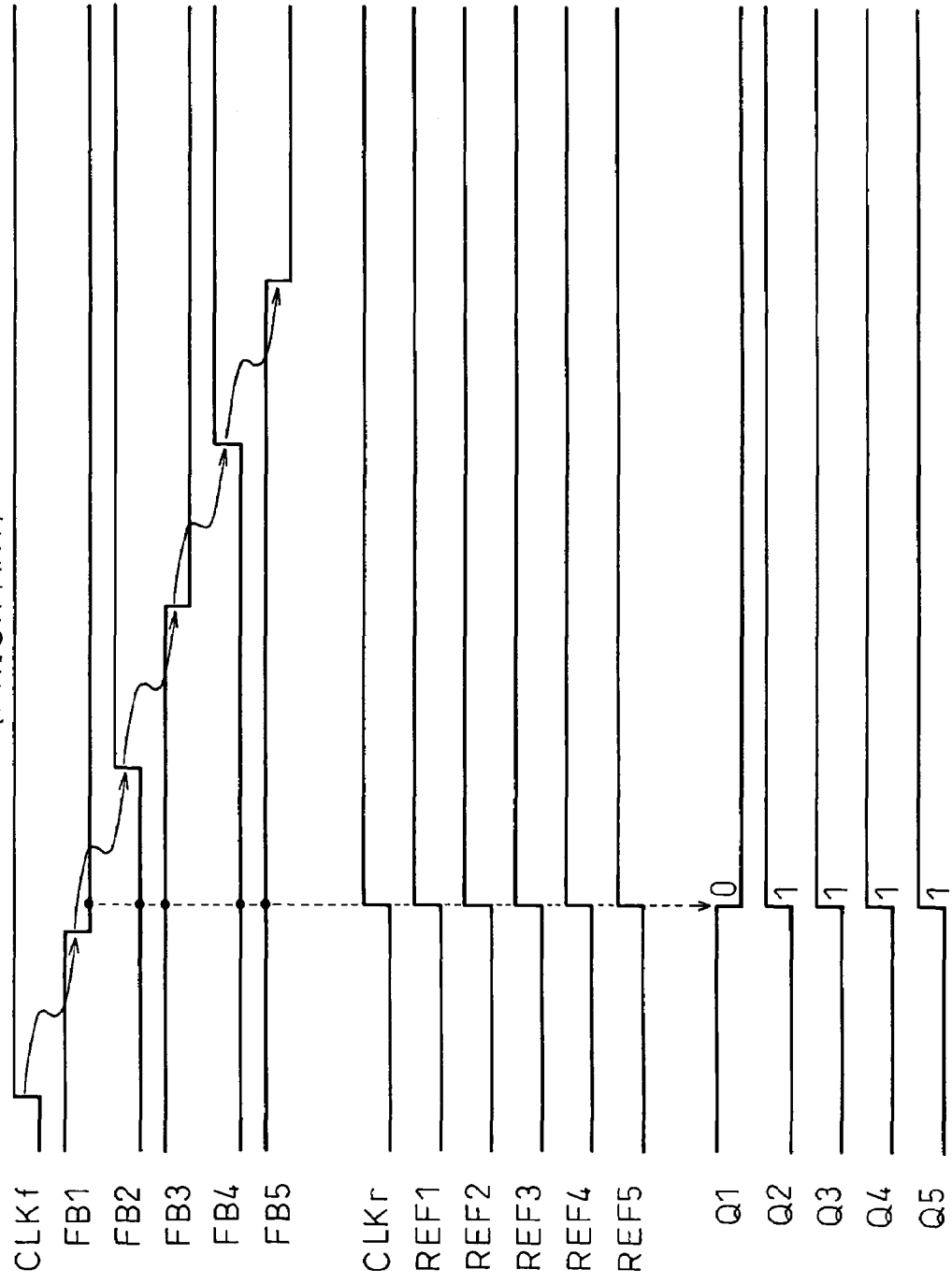
FIG. 2 is a timing diagram for explaining one example of operation of the digital phase detector shown in FIG. 1.

FIG. 2 is a timing diagram for explaining one example of operation of the digital phase detector shown in FIG. 1. For purposes of convenience, processing in five data holding circuits $103_1$ to $103_5$ is shown in FIG. 2.

As shown in FIG. 2, as the feedback clock CLKf is passed through each of the plurality of delay elements $101_1$ to $101_5$, the feedback clock CLKf is successively delayed by a delay time equivalent to one stage of the delay element 101 ($101_1$ to $101_5$), and the resulting feedback clocks FB1 to FB5 are applied to the data terminals D of the respective data holding circuits $103_1$ to $103_5$.

The reference clocks REF1 to REFn (CLKr) with the same phase are applied to the clock terminals (control terminals) of the respective data holding circuits $103_1$ to $103_5$ which then latch the corresponding clocks FB1 to FB5 by the rising edges of the respective reference clocks REF1 to REFn and supply the outputs Q1 to Q5 (Q or XQ) to the logic circuit 104.

In the digital phase detector of FIG. 1, the delay elements 101 ($101_1$ to $101_5$) are configured as inverters; here, to maintain logic integrity, the outputs Q1, Q3, and Q5 of the data holding circuits 103 ($103_1$, $103_3$, and $103_5$) at the odd-numbered stages (first, third, and fifth stages) are each taken from the positive logic output Q, while the outputs Q2 and Q4 of the data holding circuits 103 ($103_2$ and $103_4$) at the even-numbered stages (second and fourth stages) are each taken from the negative logic output XQ.

The logic circuit 104 detects a logic change in the signals Q1 to Q5, that is, the change from the logic "0" of the signal Q1 to the logic "1" of the signal Q2, and outputs the corresponding digital code.

Here, as can be seen from FIG. 2, in the configuration where the delayed feedback clocks FB1 to FB5 output from the respective delay elements 101 ($101_1$ to $101_5$) are latched into the respective data holding circuits $103_1$ to $103_5$ by the single reference clock CLKr with the same timing, the resolution is defined by the delay time that each stage of the delay elements 101 provides.

That is, since the phase detection limit is determined by the delay time of each delay element 101, the prior art digital phase detector has not been suited for use in an all digital PLL circuit, for example, in applications that require a low jitter PLL circuit.

Embodiments of a digital phase detector according to the present invention will be described in detail below with reference to the accompanying drawings.

Figure 3:
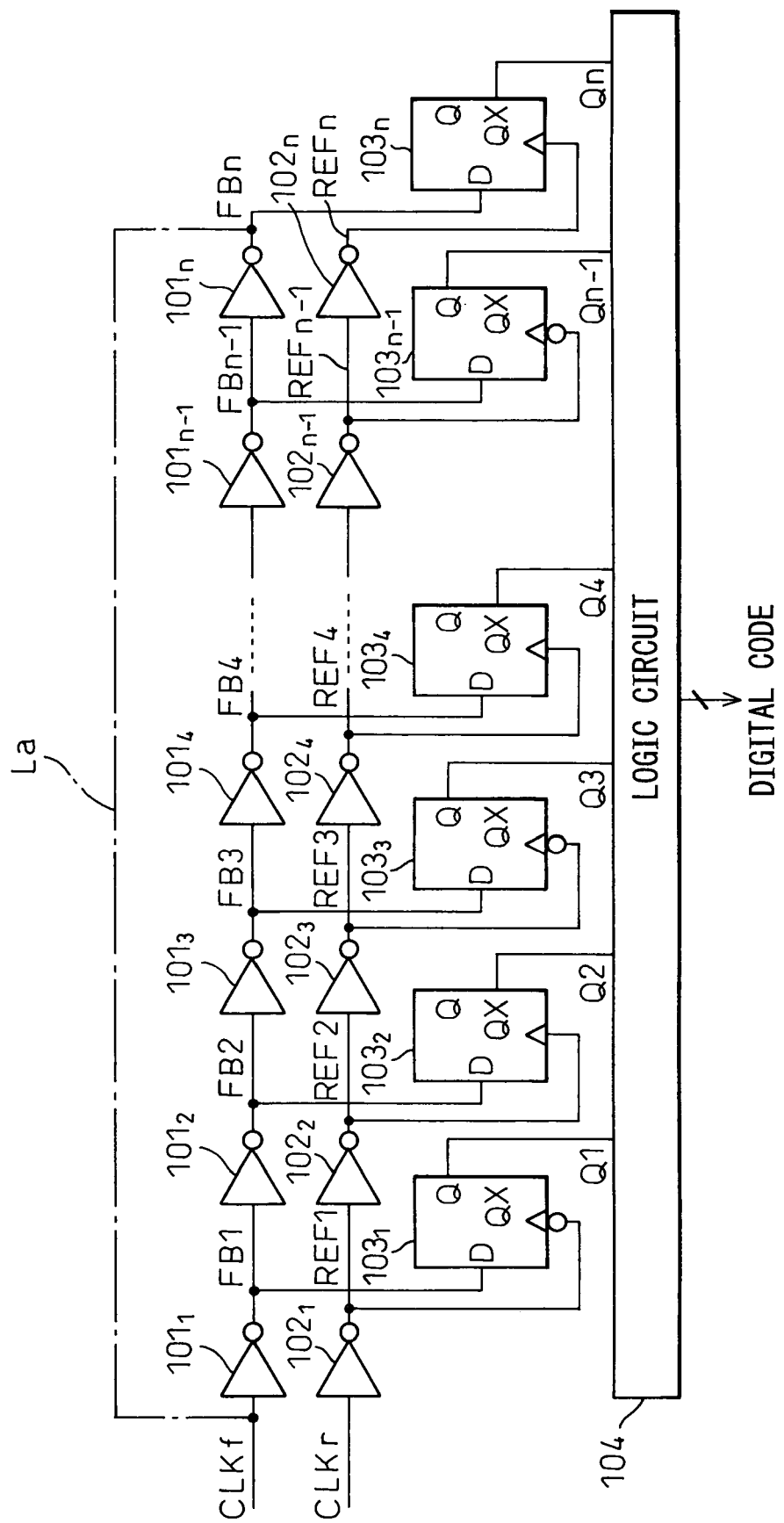
FIG. 3 is a block circuit diagram schematically showing one embodiment of a digital phase detector according to the present invention.

FIG. 3 is a block circuit diagram schematically showing one embodiment of a digital phase detector according to the present invention. In FIG. 3, reference numerals $101_1$ to $101_n$ are first delay elements (inverters), $102_1$ to $102_n$ are second delay elements (inverters), $103_1$ to $103_n$ are data holding circuits (flip-flops), 104 is a logic circuit, CLKf is a feedback clock, and CLKr is a reference clock.

As shown in FIG. 3, in the digital phase detector of this embodiment, as in the prior art digital phase detector described with reference to FIG. 1, the feedback clock CLKf is passed through the plurality of first delay elements $101_1$ to $101_n$ to generate feedback clocks (clocks FB1 to FBn) successively delayed by the delay time of each of the first delay elements $101_1$ to $101_n$.

In the digital phase detector of this embodiment, the reference clock CLKr is also delayed, that is, the reference clock CLKr is passed through the plurality of second delay elements $102_1$ to $102_n$ to generate reference clocks (clocks REF1 to REFn) successively delayed by the delay time of each of the second delay elements $102_1$ to $102_n$.

The data holding circuit $103_1$ latches the clock (feedback clock) FB1, generated by delaying the feedback clock CLKf through the single-stage first delay element $101_1$, by the edge (rising edge) of the clock (reference clock) REF1 generated by delaying the reference clock CLKr through the single-stage second delay element $102_1$. Likewise, the data holding circuit $103_2$ latches the feedback clock FB2, generated by delaying the feedback clock CLKf through the two stages of first delay elements $101_1$ and $101_2$, by the edge of the reference clock REF2 generated by delaying the reference clock CLKr through the two stages of second delay elements $102_1$ and $102_2$.

Further, the data holding circuit $103_n$ latches the feedback clock FBn, generated by delaying the feedback clock CLKf through the n stages of first delay elements $101_1$ to $101_n$, by the edge of the reference clock REFn generated by delaying the reference clock CLKr through the n stages of second delay elements $102_1$ and $102_2$. In the digital phase detector of this embodiment, the reference clocks REF1 to REFn supplied to the respective data holding circuits $103_1$ to $103_n$ differ in phase from one another, since these clocks are generated by successively delaying the input reference clock CLKr through the second delay elements $102_1$ to $102_n$.

That is, the data holding circuits $103_1$ to $103_n$ in the digital phase detector of this embodiment latch the respective feedback clocks FB1 to FBn, generated by successively delaying the feedback clock CLKf through the first delay elements $101_1$ to $101_n$, by the edges of the respective reference clocks REF1 to REFn of different phases generated by successively delaying the reference clock CLKr through the second delay elements $102_1$ to $102_n$, and output the phase differences between the feedback clocks FB1 to FBn and their corresponding reference clocks REF1 to REFn as digital signals Q1 to Qn to the logic circuit 104.

The logic circuit 104 detects a logic change in the signals Q1 to Q5, that is, the change from the logic "0" of the signal Q1 to the logic "1" of the signal Q2, and outputs the corresponding digital code.

Figure 4:
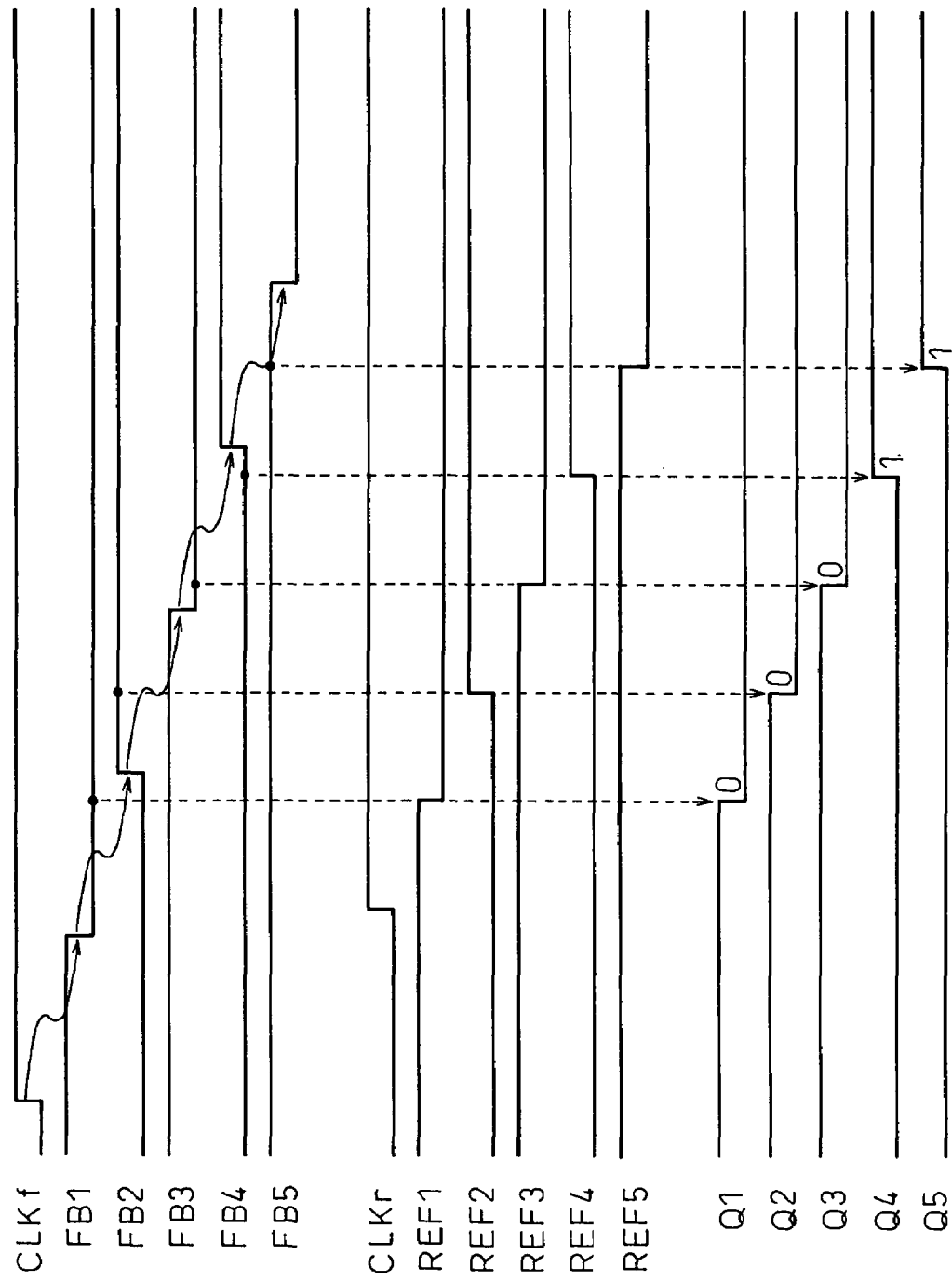
FIG. 4 is a timing diagram for explaining one example of operation of the digital phase detector shown in FIG. 3.

FIG. 4 is a timing diagram for explaining one example of operation of the digital phase detector shown in FIG. 3. For purposes of convenience, processing in five data holding circuits $103_1$ to $103_5$ is shown in FIG. 4.

As shown in FIG. 4, as the feedback clock CLKf is passed through each of the plurality of first delay elements $101_1$ to $101_5$, the feedback clock CLKf is successively delayed by a delay time equivalent to one stage of the first delay element 101 ($101_1$ to $101_5$), and the resulting feedback clocks FB1 to FB5 are applied to the data terminals D of the respective data holding circuits $103_1$ to $103_5$.

Likewise, as the reference clock CLKr is passed through each of the plurality of second delay elements $102_1$ to $102_5$, the reference clock CLKr is successively delayed by a delay time equivalent to one stage of the second delay element 102 ($102_1$ to $102_5$), and the resulting reference clocks REF1 to REFn are applied to the clock terminals of the respective data holding circuits $103_1$ to $103_5$.

The reference clocks REF1 to REFn of different phases are applied to the clock terminals of the respective data holding circuits $103_1$ to $103_5$ which then latch the corresponding clocks FB1 to FB5 by the rising edges of the respective reference clocks REF1 to REFn and supply the outputs Q1 to Q5 (Q or XQ) to the logic circuit 104.

In the digital phase detector of FIG. 3, the first delay elements 101 ($101_1$ to $101_5$) are configured as inverters; here, to maintain logic integrity, the outputs Q1, Q3, and Q5 of the data holding circuits 103 ($103_1$, $103_3$, and $103_5$) at the odd-numbered stages (first, third, and fifth stages) are each taken from the positive logic output Q, while the outputs Q2 and Q4 of the data holding circuits 103 ($103_2$ and $103_4$) at the even-numbered stages (second and fourth stages) are each taken from the negative logic output XQ.

The second delay elements 102 ($102_1$ to $102_5$) are also configured as inverters; therefore, signals created by inverting the logic states of the reference clocks REF1, REF3, and REF5 are applied to the clock terminals of the respective data holding circuits 103 ($103_1$, $103_3$, and $103_5$) at the odd-numbered stages (first, third, and fifth stages).

In the digital phase detector of this embodiment, the delay time of each first delay element 101 ($101_1$ to $101_n$) is made different from the delay time of each second delay element 102 ($102_1$ to $102_n$), so that the resolution of the digital phase detector is defined by the difference ΔD between the delay time of the first delay element 101 and the delay time of the second delay element 102. Here, the smaller the difference ΔD between the delay time of the first delay element 101 and the delay time of the second delay element 102, the higher the resolution of the digital phase detector (the accuracy (time interval) with which to detect a logic change in the corresponding feedback clocks FB1 to FBn latched by the edges of the respective reference clocks REF1 to REFn), and conversely, the larger the difference ΔD between the delay time of the first delay element 101 and the delay time of the second delay element 102, the lower the resolution of the digital phase detector.

That is, the digital phase detector of this embodiment aims to improve the phase detection resolution by inputting the feedback clock and the reference clock respectively to the first and second delay elements having different delay times and thereby shifting their phase relationship by an amount equal to the delay time difference between the first and second delay elements.

For example, if 361 first delay elements 101 ($101_1$ to $101_{361}$) and 361 second delay elements 102 ($102_1$ to $102_{361}$) are provided, the phase difference for one period can be divided over the 361 delay stages.

In this way, the phase detection resolution can be controlled by controlling the delay times of the first and second delay elements. Further, the product of the phase detection resolution and the number of stages of the first and second delay elements defines the detectable phase difference range, and the phase detection resolution and the detectable phase difference range can be controlled according to the purpose.

In FIG. 3, the digital phase detector may be configured as a ring oscillator by coupling the output of the first delay element $101_n$ at the final stage (odd-numbered stage) to the input of the first delay element (inverter) $101_1$ at the first stage, as shown by an imaginary line (semi-dashed line) La.

Figure 5:
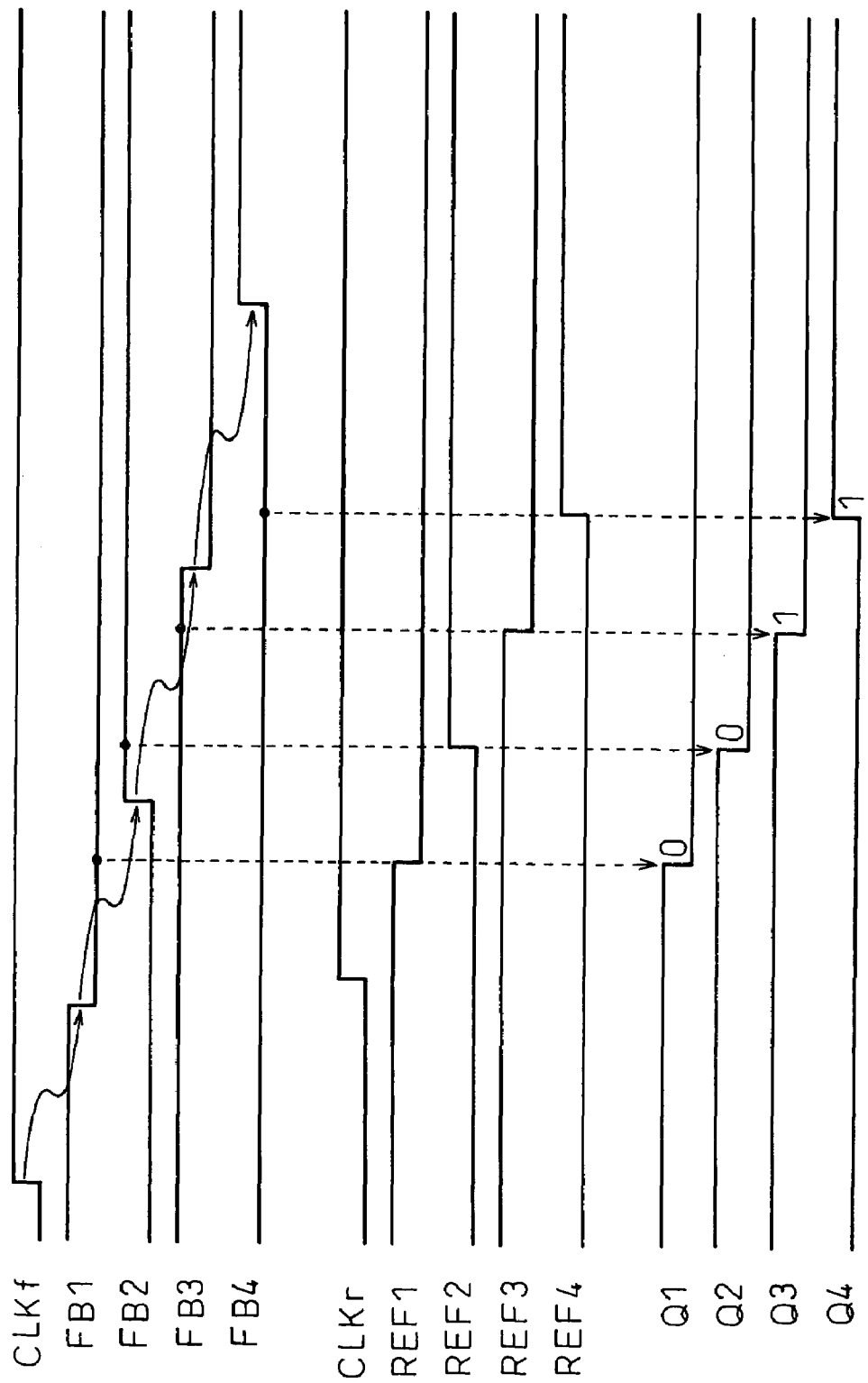
FIG. 5 is a timing diagram for explaining one example of operation of a modified example of the digital phase detector shown in FIG. 3.

FIG. 5 is a timing diagram for explaining one example of operation of a modified example of the digital phase detector shown in FIG. 3.

In the first embodiment described above, the difference ΔD between the delay time of each first delay element 101 ($101_1$ to $101_n$) and the delay time of each second delay element 102 ($102_1$ to $102_n$) has been maintained constant, but in the modified example, the difference between the delay time of the first delay element 101 and the delay time of the second delay element 102 is varied from one delay stage to another.

That is, in the first embodiment, for example, the difference (delay time difference) ΔD1 between the delay time of each first delay element 101 and the delay time of each second delay element 102 is set so that the phase difference for one period is detected over the 361 delay stages, but in the modified example shown here, the delay time difference at the first stage is set to ΔD1 and, for each successive delay stage, the delay time difference is increased by 10% from the immediately preceding stage.

Here, when the number of delay stages needed to detect the phase difference for one period is denoted by n, the following relation holds in the modified example, since the sum of the delay time differences ΔD between the delay time of each first delay element 101 and the delay time of each second delay element 102 need only be made equal to one clock period (ΔD1·361).

$$\Delta D1 + \Delta D1 \cdot 1.1 + \Delta D1 \cdot 1.2 + \ldots + \Delta D1 \cdot (1 + 0.1 \cdot (n-1)) = \Delta D1 \cdot 361$$

Solving this, we have n=76. That is, in the above example, the number of delay stages can be reduced from 361 to 76 without having to reduce the phase detection resolution for regions where the phases of the two clocks to be compared are close to each other.

By varying the delay time of each delay element from one stage to another as described above, the resolution for a particular phase difference can be enhanced while retaining the detectable phase difference range. More specifically, for example, when the phase difference between the two clocks is small, then by reducing the delay time difference between the delay elements at a low numbered stage (that is, the delay time difference between the delay time of the first delay element 101 and the delay time of the second delay element 102 at a low numbered stage is set small) the resolution can be enhanced while retaining the detectable phase difference range.

Figure 6:
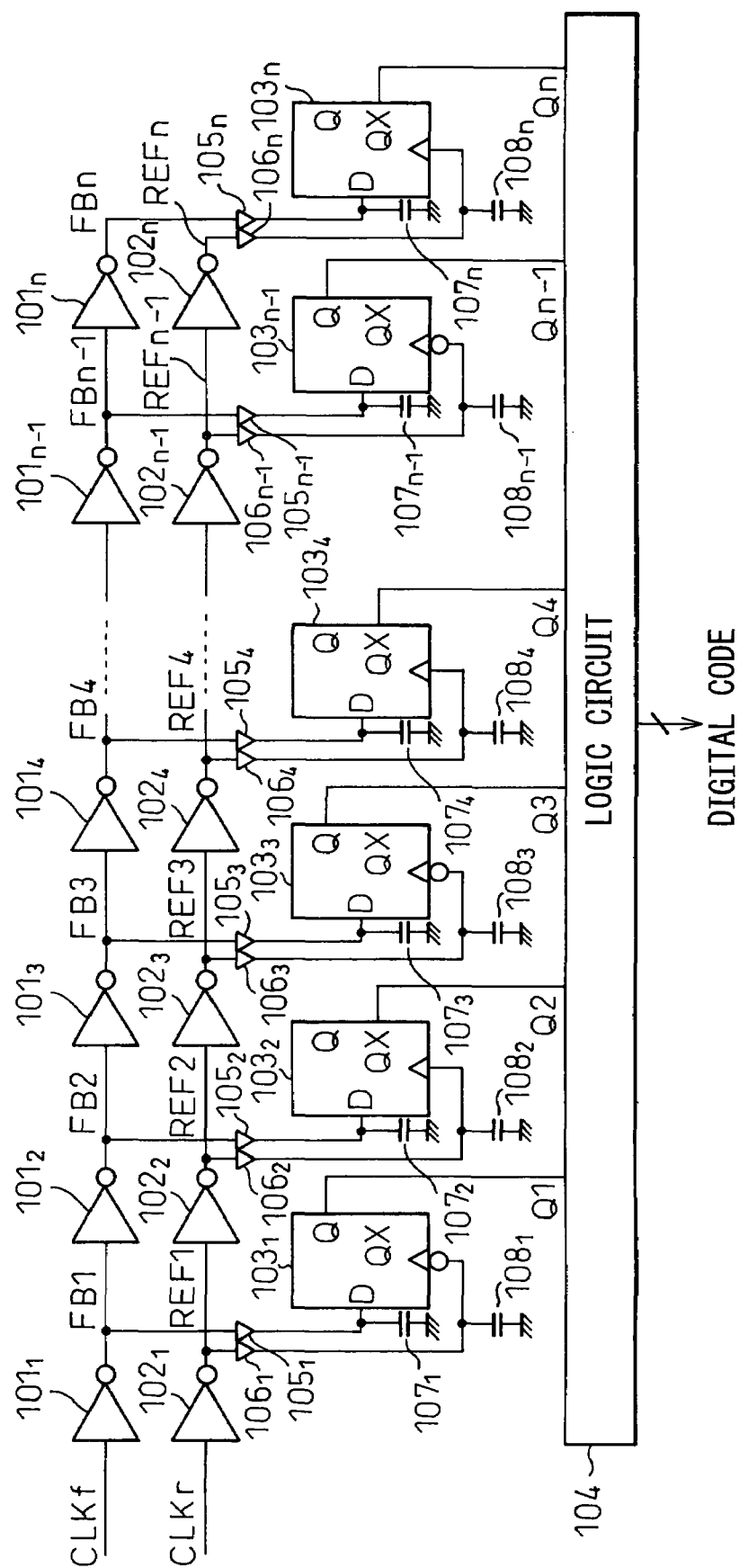
FIG. 6 is a block circuit diagram schematically showing another embodiment of a digital phase detector according to the present invention.

FIG. 6 is a block circuit diagram schematically showing another embodiment of a digital phase detector according to the present invention.

As is apparent from a comparison between FIG. 6 and FIG. 3, the digital phase detector of this embodiment differs from the digital phase detector shown in FIG. 3 in that buffers 105 ($105_1$ to $105_n$) and 106 ($106_1$ to $106_n$) and capacitors 107 ($107_1$ to $107_n$) and 108 ($108_1$ to $108_n$) are respectively provided for the data input terminal and the clock terminal of each of the data holding circuits 103 ($103_1$ to $103_n$).

More specifically, at each stage, the buffer 105 is inserted between the output of the inverter 101 and the data input terminal D of the data holding circuit 103, and the buffer 106 between the output of the inverter 102 and the clock terminal of the data holding circuit 103. Further, the capacitor 107 is inserted between ground and the data input terminal D of the data holding circuit 103, and the capacitor 108 is inserted between ground and the clock terminal of the data holding circuit 103.

The buffers 105 and 106 are provided to prevent the inverters 101 and 102 from affecting the delay times of the capacitors 107 and 108. The capacitance values of the capacitors 107 and 108 are varied according to the delay stage so that the data output timing can be changed for each of the signals Q1 to Qn.

Here, for example, a plurality of capacitors 107 and 108 may be provided respectively for the data input terminal D and the clock terminal of each data holding circuit 103, and provisions may be made to be able to trim the delay times of the first and second delay elements at each stage by adjusting the connection of the plurality of capacitors 107 and 108 by using such means as a fuse or a switch device. Further, a switch means (transistor) may be provided in series with each of the capacitors 107 and 108, with provisions made to be able to vary the delay times of the first and second delay elements at each stage by externally controlling the ON/OFF operation of the switches. These can be accomplished by applying various known techniques.

Furthermore, the delay time of the first delay element 101 and the delay time of the second delay element 102 can each be controlled as desired; here, the delay time of the first delay element and/or the delay time of the second delay element may be controlled so as to vary from one stage to another, or the difference between the delay time of the first delay element and the delay time of the second delay element may be varied (increased) by a predetermined percentage from one stage to another.

Figure 7:
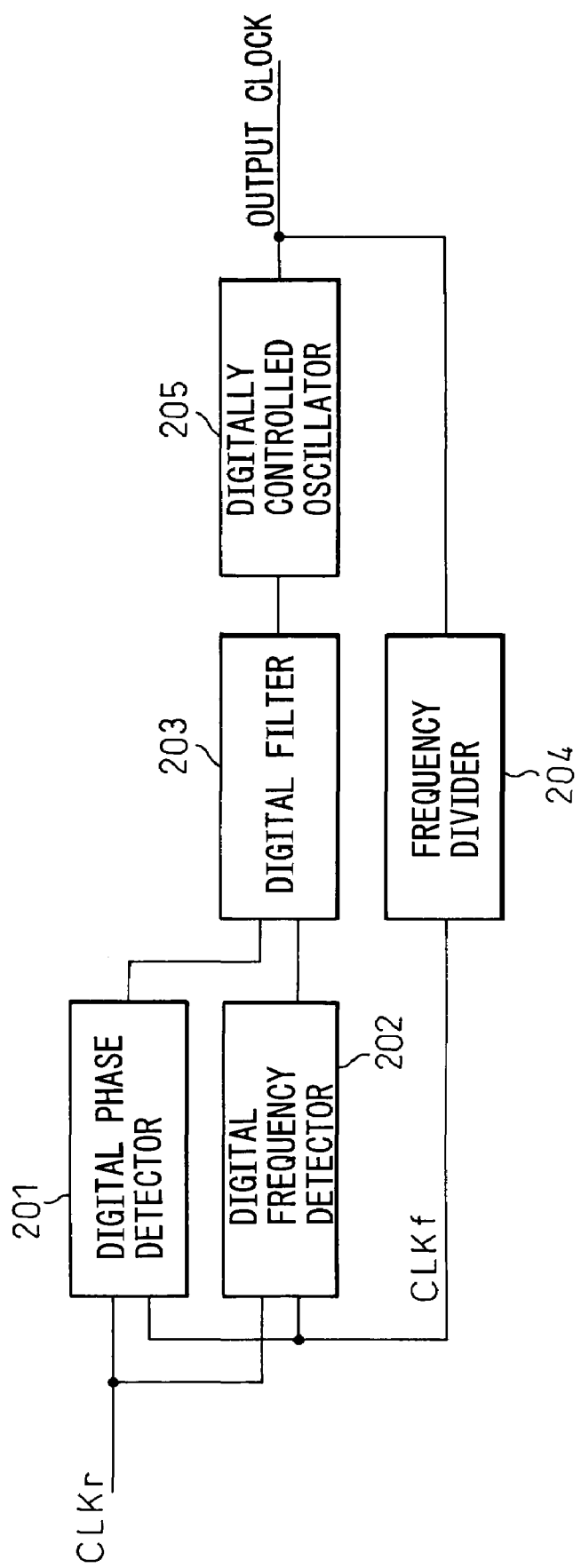
FIG. 7 is a block diagram schematically showing the general configuration of one example to which the digital phase detector of the present invention is applied.

FIG. 7 is a block diagram schematically showing the general configuration of one example to which the digital phase detector of the present invention is applied, the example showing an all digital PLL (Phase-Locked Loop) circuit.

As shown in FIG. 7, in the all digital PLL circuit, a frequency divider 204 divides the output of a digitally controlled oscillator (DCO) 205 by a specified factor, and the digital phase detector (DPD) 201 of the present invention compares the phase of the thus derived clock CLKf with the phase of the reference clock CLKr and digitizes the phase difference information. At the same time, a digital frequency detector (DFD) 202 digitizes frequency information, and the two digital signals are fed to a digital filter (DF) 203 which outputs a control signal for the digitally controlled oscillator 205, thus performing control so that the output signal of the digitally controlled oscillator 205 synchronizes to the reference clock CLKr.

Figure 8:
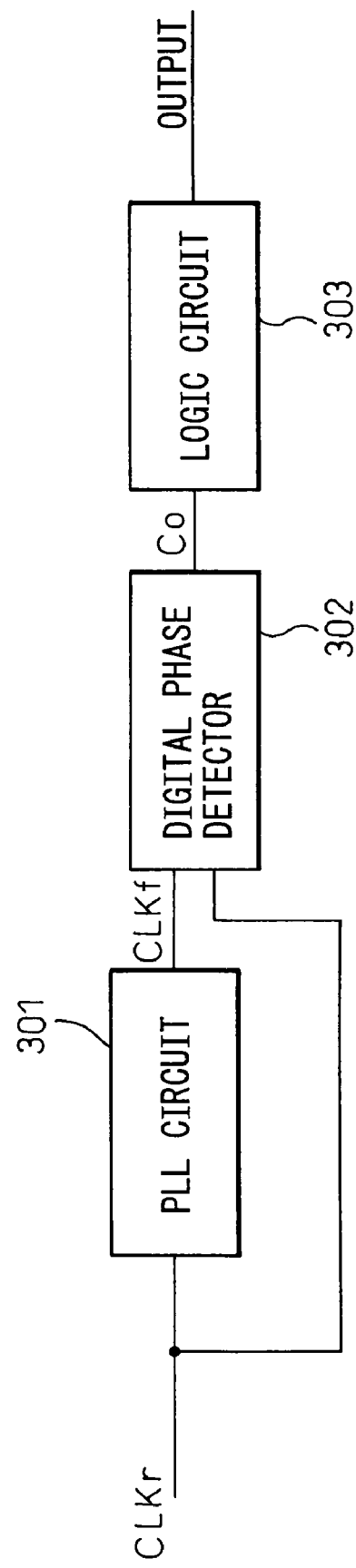
FIG. 8 is a block diagram schematically showing the general configuration of another example to which the digital phase detector of the present invention is applied.

FIG. 8 is a block diagram schematically showing the general configuration of another example to which the digital phase detector of the present invention is applied, the example showing a lock detection circuit.

As shown in FIG. 8, in the lock detection circuit, the output clock CLKf of the PLL circuit 301 and the reference clock CLKr are input to the digital phase detector (DPD) 302 of the present invention to compare their phases. Then, if the output code Co of the digital phase detector 302 shows that the phase difference between the two clocks CLKf and CLKr is within the desired difference, a logic circuit 303 at the subsequent stage outputs a signal indicating that the phase lock has been achieved. This lock detection circuit can be used, for example, at the time of testing to detect whether the clock has acquired lock or not.

Further, by making provisions to accumulate the output code of the digital phase detector for a desired length of time, the same circuit configuration can be used as a phase jitter detection circuit.

In this way, the digital phase detector of the present invention can be applied not only to an all digital PLL circuit but also to various other circuits.

As described above, according to the digital phase comparator of the present invention, a digital phase comparator can be provided that can detect very small phase differences without its phase detection limit being limited by the delay time of each delay element.

The digital phase detector of the present invention can be applied extensively not only to an all digital PLL circuit but also to various other circuits such as a lock detection circuit which is used at the time of testing.

Many different embodiments of the present invention may be constructed without departing from the spirit and scope of the present invention, and it should be understood that the present invention is not limited to the specific embodiments described in this specification, except as defined in the appended claims.

What is claimed is:

1. A digital phase detector comprising:
   a plurality of first delay elements through which a first clock is delayed;
   a plurality of second delay elements through which a second clock is delayed; and
   a plurality of data holding circuits which, in accordance with said second clock successively delayed through said second delay elements, latch said first clock successively delayed through said first delay elements and hold a digital value representing a relative phase difference, wherein said digital phase detector is configured as a ring oscillator.

2. The digital phase detector as claimed in claim 1, wherein the delay time of said first delay elements is controlled.

3. The digital phase detector as claimed in claim 2, wherein the delay time of said first delay elements is varied from one stage to another.

4. The digital phase detector as claimed in claim 1, wherein the delay time of said second delay elements is controlled.

5. The digital phase detector as claimed in claim 4, wherein the delay time of said second delay elements is varied from one stage to another.

6. The digital phase detector as claimed in claim 1, wherein the delay time of said first delay elements and the delay time of said second delay elements are controlled.

7. The digital phase detector as claimed in claim 6, wherein the delay time of said first delay elements and the delay time of said second delay elements are varied from one stage to another.

8. The digital phase detector as claimed claim 2, wherein the difference between the delay time of said first delay elements and the delay time of said second delay elements is varied by a predetermined percentage from one stage to another.

9. The digital phase detector as claimed in claim 1, wherein said data holding circuits are flip-flops, and wherein said second clock delayed through each of said second delay elements is applied to a clock terminal of a corresponding one of said flip-flops, while said first clock delayed through each of said first delay elements is applied to a data terminal of a corresponding one of said flip-flops.

* * * * *